United States Patent
Kumata

(10) Patent No.: US 12,284,456 B2
(45) Date of Patent: Apr. 22, 2025

(54) IMAGING DEVICE AND DISTANCE MEASUREMENT SYSTEM

(71) Applicant: SONY SEMICONDUCTOR SOLUTIONS CORPORATION, Kanagawa (JP)

(72) Inventor: Keishi Kumata, Kanagawa (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 0 days.

(21) Appl. No.: 18/259,334

(22) PCT Filed: Dec. 6, 2021

(86) PCT No.: PCT/JP2021/044739
§ 371 (c)(1),
(2) Date: Jun. 26, 2023

(87) PCT Pub. No.: WO2022/149388
PCT Pub. Date: Jul. 14, 2022

(65) Prior Publication Data
US 2024/0314467 A1     Sep. 19, 2024

(30) Foreign Application Priority Data

Jan. 5, 2021   (JP) ................................. 2021-000561

(51) Int. Cl.
*H04N 25/772*   (2023.01)
*H04N 23/56*   (2023.01)
(Continued)

(52) U.S. Cl.
CPC ........... *H04N 25/772* (2023.01); *H04N 23/56* (2023.01); *H04N 23/667* (2023.01);
(Continued)

(58) Field of Classification Search
CPC .... H04N 25/772; H04N 23/56; H04N 23/667; H04N 25/705; H04N 25/779; H04N 25/7795; H04N 25/78; H04N 25/767
See application file for complete search history.

(56) References Cited

U.S. PATENT DOCUMENTS

| 10,887,536 B2 * | 1/2021 | Lim ..................... H01L 27/1461 |
| 11,356,626 B2 * | 6/2022 | Wang ................ H01L 27/14645 |

(Continued)

FOREIGN PATENT DOCUMENTS

| JP | 2001-298662 A | 10/2001 |
| JP | 2005-323331 A | 11/2005 |
| JP | 2008-544656 A | 12/2008 |

OTHER PUBLICATIONS

International Search Report and Written Opinion of PCT Application No. PCT/JP2021/044739, issued on Feb. 15, 2022, 08 pages of ISRWO.

*Primary Examiner* — Nicholas G Giles
(74) *Attorney, Agent, or Firm* — CHIP LAW GROUP

(57) ABSTRACT

Provided is an imaging device capable of suppressing a decrease in a frame rate while improving charge transfer efficiency. An imaging device according to an embodiment of the present disclosure includes: a photoelectric conversion element; a signal converter that is boosted when charge transferred from the photoelectric conversion element is converted into a pixel signal; a selection transistor that interrupts a signal line of the pixel signal during a boosting period of the signal converter; a comparator including a non-inverting input terminal to which the pixel signal is input via the selection transistor, an inverting input terminal to which a ramp signal is input, and an output terminal which outputs a comparison result between the pixel signal and the ramp signal; and a correction circuit that holds a potential of the non-inverting input terminal in the boosting period at a (Continued)

potential of the non-inverting input terminal before the boosting period.

17 Claims, 12 Drawing Sheets

(51) Int. Cl.
*H04N 23/667* (2023.01)
*H04N 25/705* (2023.01)
*H04N 25/76* (2023.01)
*H04N 25/767* (2023.01)
*H04N 25/779* (2023.01)
*H04N 25/78* (2023.01)

(52) U.S. Cl.
CPC ......... *H04N 25/705* (2023.01); *H04N 25/779* (2023.01); *H04N 25/7795* (2023.01); *H04N 25/78* (2023.01); *H04N 25/767* (2023.01)

(56) References Cited

U.S. PATENT DOCUMENTS

| | | | |
|---|---|---|---|
| 11,637,979 B2 * | 4/2023 | Lee | H04N 25/709 |
| | | | 348/294 |
| 2019/0222781 A1 * | 7/2019 | Lim | H04N 25/618 |
| 2019/0306445 A1 | 10/2019 | Kim | |
| 2021/0029316 A1 * | 1/2021 | Lee | H01L 27/14636 |
| 2021/0337144 A1 * | 10/2021 | Wang | H01L 27/14645 |

* cited by examiner

IMAGING DEVICE AND DISTANCE MEASUREMENT SYSTEM

CROSS REFERENCE TO RELATED APPLICATIONS

This application is a U.S. National Phase of International Patent Application No. PCT/JP2021/044739 filed on Dec. 6, 2021, which claims priority benefit of Japanese Patent Application No. JP 2021-000561 filed in the Japan Patent Office on Jan. 5, 2021. Each of the above-referenced applications is hereby incorporated herein by reference in its entirety.

TECHNICAL FIELD

The present disclosure relates to an imaging device and a distance measurement system.

BACKGROUND ART

In applications of an imaging device and a distance measurement system, it has been known to boost floating diffusion (FD) that holds charge in order to increase transfer efficiency of charge accumulated in a photoelectric conversion element of a pixel array. At this time, a signal line of a pixel signal is sometimes interrupted during a boosting period in order to avoid black floating (flare).

CITATION LIST

Patent Document

Patent Document 1: Japanese Patent Application National Publication (Laid-Open) No. 2008-544656

SUMMARY OF THE INVENTION

Problems to be Solved by the Invention

When the signal line of the pixel signal is interrupted during the boosting period of the FD, a voltage drop occurs in a comparator that processes the pixel signal. There is a possibility that such a voltage drop increases a settling time so that a frame rate decreases.

The present disclosure provides an imaging device and a distance measurement system capable of suppressing a decrease in a frame rate while improving charge transfer efficiency.

Solutions to Problems

An imaging device according to an embodiment of the present disclosure includes: a photoelectric conversion element; a signal converter that is boosted when charge transferred from the photoelectric conversion element is converted into a pixel signal; a selection transistor that interrupts a signal line of the pixel signal during a boosting period of the signal converter; a comparator including a non-inverting input terminal to which the pixel signal is input via the selection transistor, an inverting input terminal to which a ramp signal is input, and an output terminal which outputs a comparison result between the pixel signal and the ramp signal; and a correction circuit that holds a potential of the non-inverting input terminal in the boosting period at a potential of the non-inverting input terminal before the boosting period.

The correction circuit may include: a first transistor arranged between the selection transistor and the non-inverting input terminal; a second transistor paired with the first transistor; a first switch arranged between a gate of the first transistor and a gate of the second transistor; a second switch arranged between a source of the first transistor and a source of the second transistor; and a capacitor connected to the gate of the second transistor, and, in the boosting period, the first switch may be in an off-state and the second switch may be in an on-state.

A threshold voltage between the gate and the source of the first transistor may be equal to a threshold voltage between the gate and the source of the second transistor.

Immediately before the boosting period, the first switch may be switched from an on-state to the off-state, and the second switch may be switched from an off-state to the on-state. In an auto-zero period of the comparator before the boosting period, the selection transistor may be switched from an on-state to an off-state, the first switch may be switched from an on-state to the off-state, and the second switch may be switched from an off-state to the on-state.

The first switch may be an N-channel MOSFET.

The photoelectric conversion element, the signal converter, and the selection transistor may be arranged on a first semiconductor substrate, and the comparator and the correction circuit may be arranged on a second semiconductor substrate stacked on the first semiconductor substrate.

The photoelectric conversion element, the signal converter, the selection transistor, the comparator, and the correction circuit may be arranged on one semiconductor substrate.

A plurality of the photoelectric conversion elements may be two-dimensionally arranged, and the comparator and the correction circuit may be provided for each of the photoelectric conversion elements.

The imaging device may adopt a global shutter system in which the plurality of photoelectric conversion elements accumulates the charge at the same timing.

The imaging device may adopt a rolling shutter system in which the plurality of photoelectric conversion elements accumulates the charge at different timings.

A distance measurement system according to one embodiment of the present disclosure includes: an illumination device that emits distance measurement light; and an imaging device that receives reflected light of the distance measurement light. The imaging device includes: a photoelectric conversion element that photoelectrically converts the reflected light; a signal converter that is boosted when charge transferred from the photoelectric conversion element is converted into a pixel signal; a selection transistor that interrupts a signal line of the pixel signal during a boosting period of the signal converter; a comparator including a non-inverting input terminal to which the pixel signal is input via the selection transistor, an inverting input terminal to which a ramp signal is input, and an output terminal which outputs a comparison result between the pixel signal and the ramp signal; and a correction circuit that holds a potential of the non-inverting input terminal in the boosting period at a potential of the non-inverting input terminal before the boosting period.

The correction circuit may include: a first transistor arranged between the selection transistor and the non-inverting input terminal; a second transistor paired with the first transistor; a first switch arranged between a gate of the first transistor and a gate of the second transistor; a second switch arranged between a source of the first transistor and a source of the second transistor; and a capacitor connected to the gate of the second transistor, and, in the boosting period, the first switch may be in an off-state and the second switch may be in an on-state.

A threshold voltage between the gate and the source of the first transistor may be equal to a threshold voltage between the gate and the source of the second transistor.

Immediately before the boosting period, the first switch may be switched from an on-state to the off-state, and the second switch may be switched from an off-state to the on-state.

The photoelectric conversion element, the signal converter, and the selection transistor may be arranged on a first semiconductor substrate, and the comparator and the correction circuit may be arranged on a second semiconductor substrate stacked on the first semiconductor substrate.

The photoelectric conversion element, the signal converter, the selection transistor, the comparator, and the correction circuit may be arranged on one semiconductor substrate.

MODE FOR CARRYING OUT THE INVENTION

First Embodiment

Figure 1:
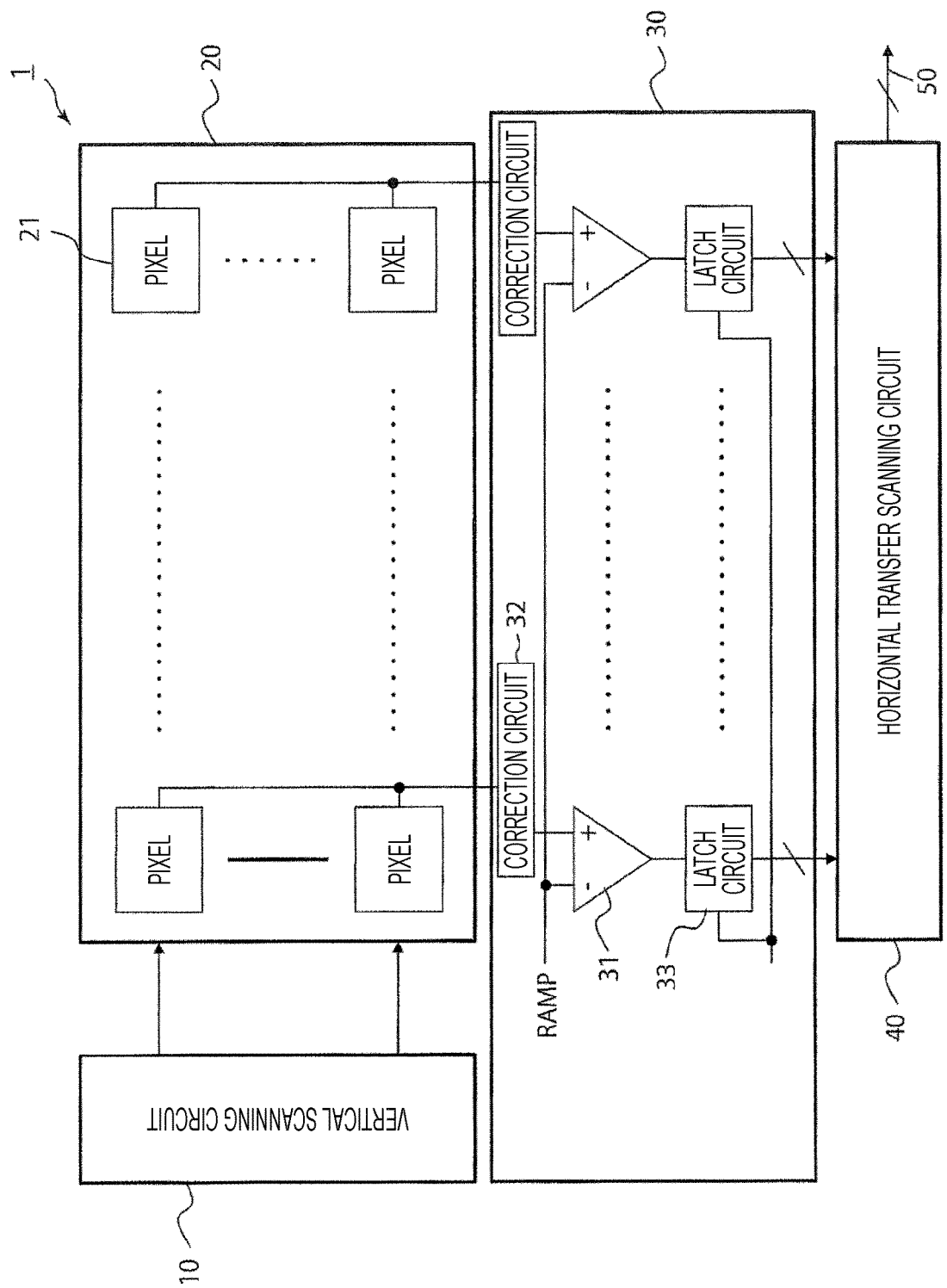
FIG. 1 is a diagram depicting a configuration of an imaging device according to a first embodiment.

FIG. 1 is a diagram depicting a configuration of an imaging device according to a first embodiment. An imaging device 1 depicted in FIG. 1 includes a vertical scanning circuit 10, a pixel array 20, a signal processing circuit 30, and a horizontal transfer scanning circuit 40.

The vertical scanning circuit 10 includes, for example, a shift register, and transmits a drive signal to the pixel array 20. In the pixel array 20, a plurality of pixels 21 is arranged two-dimensionally (in a matrix). The plurality of pixels 21 is vertically scanned by the vertical scanning circuit 10. In other words, the plurality of pixels 21 is driven on the basis of the drive signal that is input for each row from the vertical scanning circuit 10. The imaging device 1 functions as an image sensor of a global shutter system in which all the pixels 21 accumulate (expose) charge at the same timing.

The signal processing circuit 30 processes signals output from the pixel array 20. In the present embodiment, the signal processing circuit 30 is a column analog-to-digital converter (ADC) that processes a pixel signal for each column of the pixel array 20. The signal processing circuit 30 includes a comparator 31, a correction circuit 32, and a latch circuit 33. The number of comparators 31, the number of correction circuits 32, and the number of latch circuits 33 are the same as the number of columns of the pixel array 20.

The pixel signal read from the pixel 21 is input to a non-inverting input terminal (+) of the comparator 31. Furthermore, a ramp signal RAMP of a triangular wave is input to an inverting input terminal (−). Moreover, an output terminal outputs a result of a comparison between a voltage of the ramp signal and a voltage of the pixel signal to the latch circuit 33.

The correction circuit 32 is arranged between the non-inverting input terminal (+) of the comparator 31 and the pixel array 20. The correction circuit 32 corrects a potential of the non-inverting input terminal (+).

The latch circuit 33 temporarily stores the comparison result of the comparator 31. Furthermore, the latch circuit 33 outputs the temporarily stored signal to the horizontal transfer scanning circuit 40 at a predetermined timing.

The horizontal transfer scanning circuit 40 includes, for example, a shift register, and performs horizontal scanning. Specifically, the latch circuit 33 transmits the signal stored in each of the latch circuits 33 to a signal line 50 according to the column order of the pixel array 20.

Figure 2:
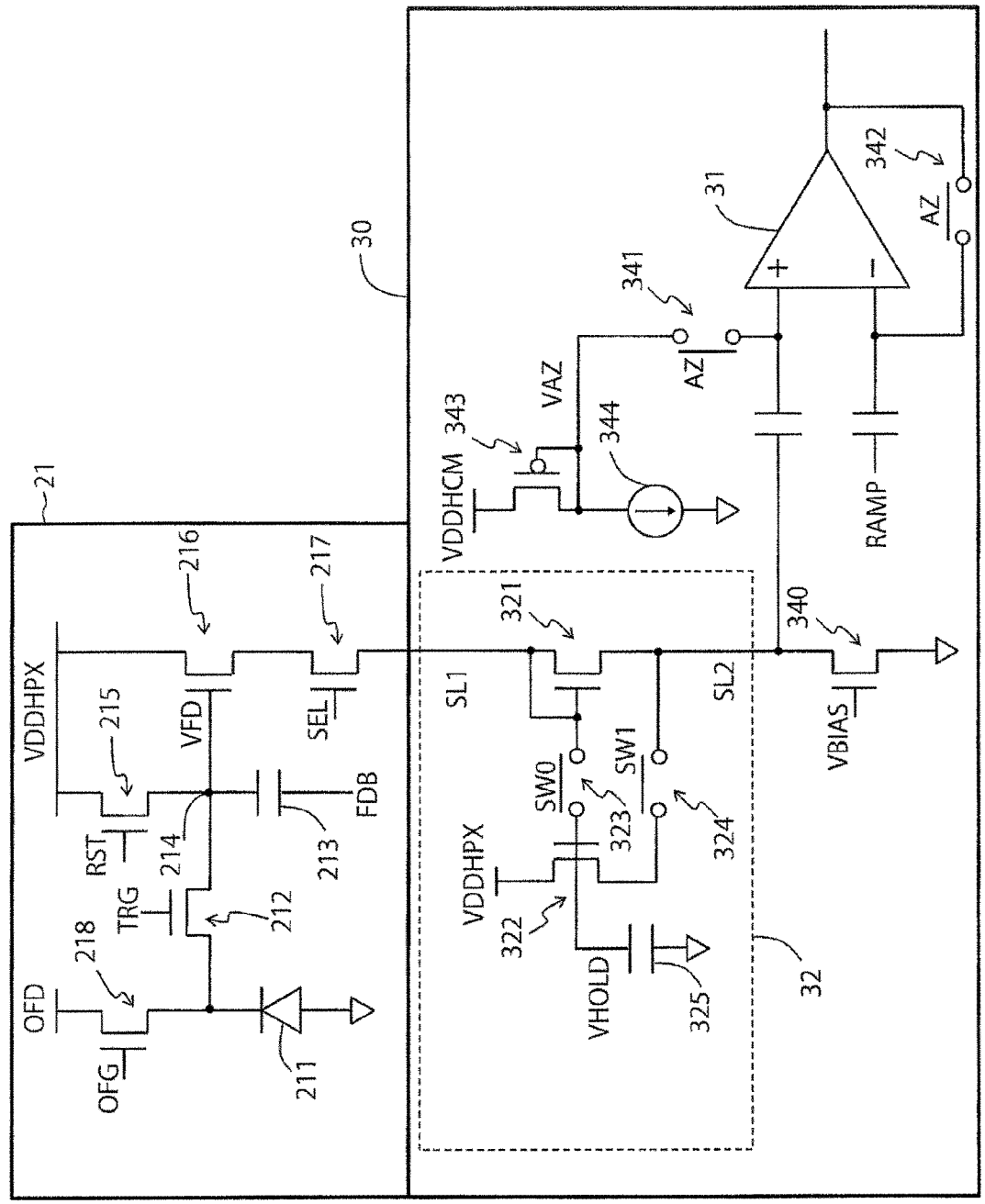
FIG. 2 is a diagram depicting circuit configurations of a pixel and a correction circuit.

FIG. 2 is a diagram depicting circuit configurations of the pixel 21 and the correction circuit 32. First, the circuit configuration of the pixel 21 will be described.

As depicted in FIG. 2, the pixel 21 includes a photodiode 211, a transfer transistor 212, a floating diffusion (FD) 213, a node 214, a reset transistor 215, an amplification transistor 216, a selection transistor 217, and a discharge transistor 218.

The photodiode 211 is an example of a photoelectric conversion element that converts incident light into charge by photoelectric conversion, and accumulates the charge. The photodiode 211 has an anode that is grounded and a cathode that is connected to the transfer transistor 212 and the discharge transistor 218.

The transfer transistor 212 includes, for example, an N-channel metal oxide semiconductor field effect transistor (MOSFET). A transfer signal TRG is input from the vertical scanning circuit 10 to a gate of the transfer transistor 212. The transfer transistor 212 is driven on the basis of the transfer signal TRG. When the transfer transistor 212 is put into an on-state, the charge accumulated in the photodiode 211 is transferred to the FD 213.

The FD 213 is a floating diffusion region having a predetermined storage capacitance connected to a gate of the amplification transistor 216. The FD 213 temporarily stores the charge transferred from the photodiode 211.

The node 214 is a connection point between one end of the FD 213 and the gate of the amplification transistor 216. The charge accumulated in the FD 213 is transferred to the amplification transistor 216 via the node 214.

The amplification transistor 216 includes, for example, an N-channel MOSFET. The amplification transistor 216 outputs a pixel signal indicating a level corresponding to the amount of charge accumulated in the FD 213, in other words, a level of a voltage VFD of the node 214.

The FD 213, the node 214, and the amplification transistor 216 function as a signal converter that converts the charge accumulated in the photodiode 211 into a pixel signal of a level corresponding to the amount of the charge. Furthermore, the node 214 can be boosted by making a voltage FDB at the other end of the FD 213 variable. Therefore, transfer efficiency of the charge accumulated in the photodiode 211 can be increased, and a saturation charge amount (Qs) can be further increased.

The reset transistor 215 includes, for example, an N-channel MOSFET. A reset signal RST is input from the vertical scanning circuit 10 to a gate of the reset transistor 215. The reset transistor 215 is driven on the basis of the reset signal RST. When the reset transistor 215 is put into an on-state, the charge accumulated in the node 214 is discharged to a power supply line VDDHPX, and the node 214 is reset. When the resetting of the node 214 is completed, the reset transistor 215 is switched from the on-state to an off-state.

The selection transistor 217 includes, for example, an N-channel MOSFET. A selection signal SEL is input from the vertical scanning circuit 10 to a gate of the selection transistor 217. The selection transistor 217 switches whether or not to transmit an image signal to the signal processing circuit 30 on the basis of the selection signal SEL. When the selection transistor 217 is put into an on-state, a pixel signal can be output to the signal processing circuit 30 through a signal line SL1. On the other hand, when the selection transistor 217 is put into an off-state, the transmission of the pixel signal through the signal line SL1 is interrupted.

The discharge transistor 218 includes, for example, an N-channel MOSFET. The discharge transistor 218 is arranged in series between the photodiode 211 and an overflow drain OFD. Furthermore, a discharge signal OFG is input from the vertical scanning circuit 10 to a gate of the discharge transistor 218. The discharge transistor 218 is driven on the basis of the discharge signal OFG. When the discharge transistor 218 is put into an on-state, the charge accumulated in the photodiode 211 is released.

Next, the circuit configuration of the correction circuit 32 will be described. As depicted in FIG. 2, the correction circuit 32 includes a first transistor 321, a second transistor 322, a first switch 323, a second switch 324, and a capacitor 325.

The first transistor 321 is arranged between the selection transistor 217 and the non-inverting input terminal (+) of the comparator 31. The first transistor 321 includes, for example, an N-channel MOSFET and has a gate and a drain that are short-circuited. Furthermore, the gate is connected to the first switch 323. The drain is connected to a source of the selection transistor 217. A source is connected to the non-inverting input terminal of the comparator 31 and is grounded via a transistor 340.

The second transistor 322 is paired with the first transistor 321. That is, the first transistor 321 and the second transistor 322 are manufactured to the same size by the same process, and thus, have equivalent electrical characteristics. In the present embodiment, a threshold voltage between a gate and a source of the second transistor 322 is equal to a threshold voltage between the gate and the source of the first transistor 321. Note that the threshold voltage is desirably as low as possible in order to avoid narrowing a dynamic range of the signal line SL1.

The first switch 323 is arranged between the gate of the first transistor 321 and the gate of the second transistor 322. The first transistor 321 performs a switching operation on the basis of a control signal SW0 input from a control circuit (not depicted) of the signal processing circuit 30.

The second switch is arranged between the source of the first transistor 321 and the source of the second transistor 322. The second transistor 322 is also driven on the basis of a control signal SW1 input from the control circuit described above. Note that, when one of the first transistor 321 and the second transistor 322 is in an on-state, the other is in an off-state.

The capacitor 325 has one end that is connected to the gate of the second transistor 322 and the other end that is grounded. When the selection transistor 217 and the first switch 323 are in the on-state, the capacitor 325 is charged. Furthermore, when the selection transistor 217 and the first switch 323 are in the off-state and the second switch 324 is in the on-state, a voltage of a signal line SL2 is held. The voltage of the signal line SL2 corresponds to a voltage of the inverting input terminal (+) of the comparator 31.

In the present embodiment, a plurality of circuit elements is arranged around the comparator 31 as depicted in FIG. 2 in order to perform auto-zero in which a reference is set for a signal input to the non-inverting input terminal (+) and a signal input to the inverting input terminal (−) in the comparator 31. Here, each of the circuit elements will be described.

A switch 341 is connected to the non-inverting input terminal (+) of the comparator 31, and a switch 342 is connected to the inverting input terminal (−). A transistor 343 is connected to the switch 341. The transistor 343 is a P-channel MOSFET. The transistor 343 has a drain that is connected to a power supply line VDDHCM and a source that is connected to a current source 344.

On the other hand, the switch 342 is connected to the output terminal of the comparator 31. That is, the inverting input terminal (−) and the output terminal are connected to each other via the switch 342 in the comparator 31. The switch 341 and the switch 342 are driven on the basis of an auto-zero signal AZ input from the control circuit (not depicted) of the signal processing circuit 30.

Figure 3:
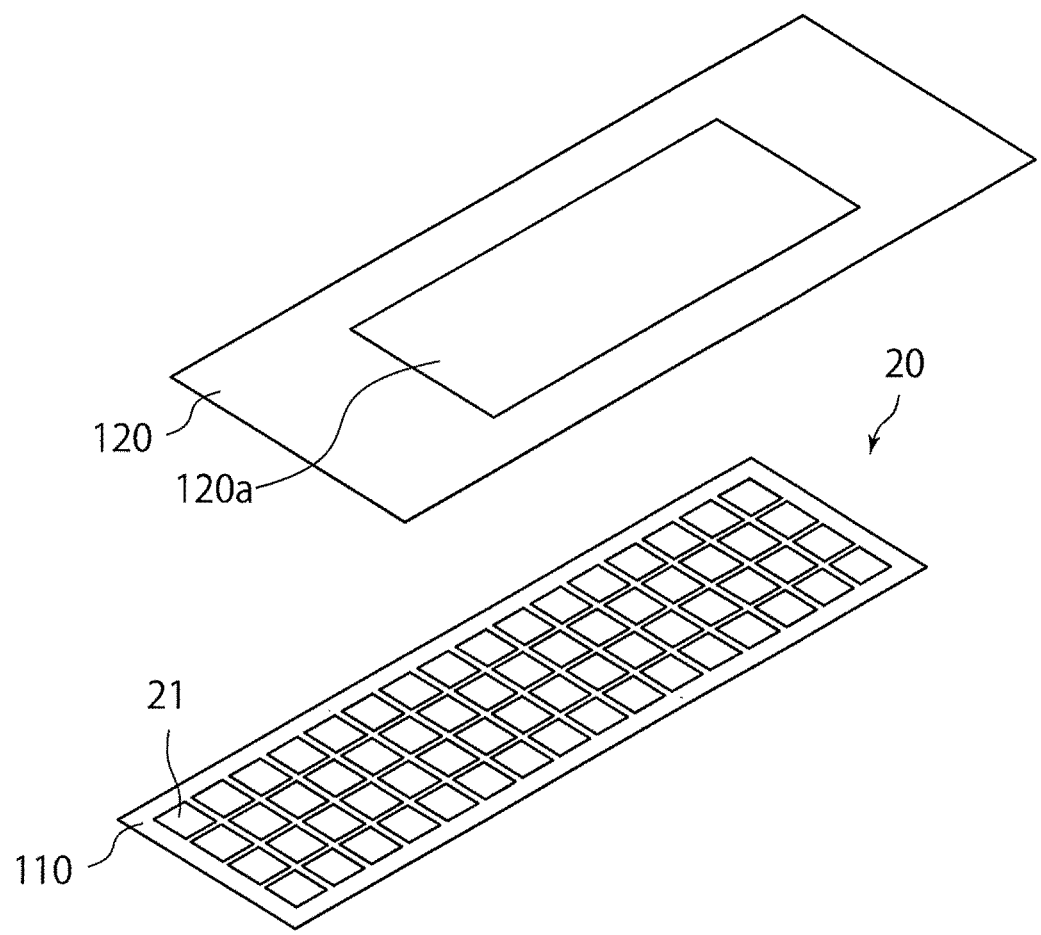
FIG. 3 is a layout diagram depicting an example of a positional relationship between a pixel array and a signal processing circuit.

FIG. 3 is a layout diagram depicting an example of a positional relationship between the pixel array 20 and the signal processing circuit 30. In the present embodiment, the pixel array 20 is formed on a first semiconductor substrate (a pixel chip) 110 as depicted in FIG. 3. On the first semiconductor substrate 110, the plurality of pixels 21 is two-dimensionally arranged.

A second semiconductor substrate (a logic chip) 120 is stacked on the first semiconductor substrate 110. The second semiconductor substrate 120 has a region 120a facing the pixel array 20. The signal processing circuit 30 is formed in the region 120a. Elements of the signal processing circuit 30 are arranged so as not to disturb reception of light by the photodiode 211 of each of the pixels 21. The first semiconductor substrate 110 and the second semiconductor substrate 120 are bonded to each other by, for example, a copper pad, a bump, or a through silicon via (TSV). When a two-layer structure in which the pixel array 20 and the signal processing circuit 30 are arranged on different semiconductor substrates is adopted as in the present embodiment, it is possible to secure a sufficiently large light reception area of the photodiode 211.

Note that the pixel array 20 and the signal processing circuit 30 may be formed on the first semiconductor substrate 110 together without being limited to the two-layer structure described above. In this case, the signal processing circuit 30 is arranged around the pixel array 20. When the pixel array 20 and the signal processing circuit 30 are formed on one semiconductor substrate in this manner, the substrate joining processing becomes unnecessary.

Figure 4:
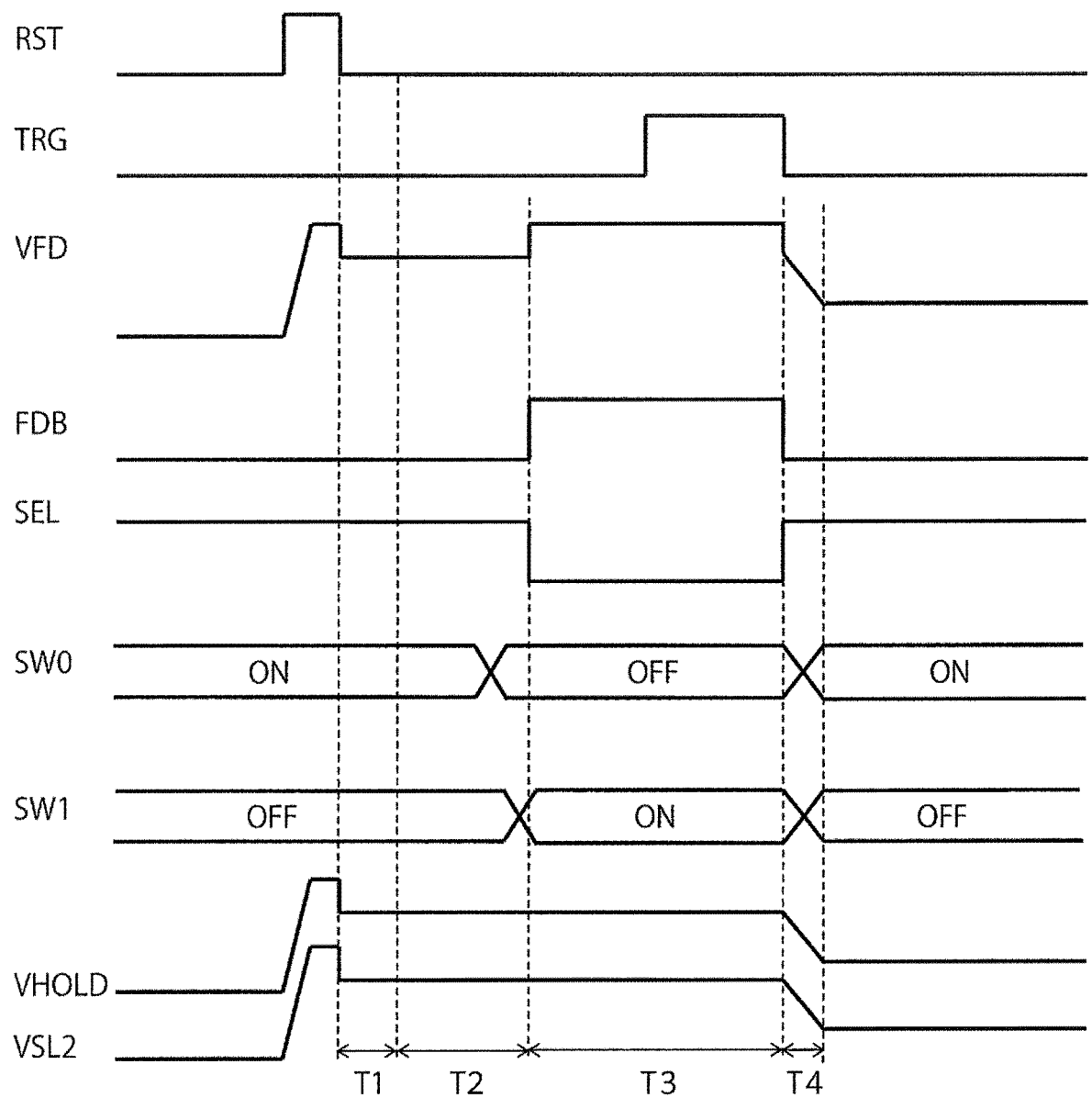
FIG. 4 is a timing chart of the imaging device according to the first embodiment.

FIG. 4 is a timing chart of the imaging device 1 described above. Hereinafter, the operation of the imaging device 1 will be described with reference to FIG. 4.

When the reset signal RST of a high level is input to the gate of the reset transistor 215 of the pixel 21, the reset transistor 215 is put into the on-state. Therefore, the voltage VFD of the node 214 increases. At this time, the selection transistor 217 is also put into the on-state on the basis of the selection signal SEL of a high level. Moreover, the first switch 323 of the correction circuit 32 is in the on-state on the basis of the control signal SW0 of a high level, and the second switch 324 is in the off-state on the basis of the control signal SW1 of a low level. Therefore, a voltage VHOLD of the capacitor 325 and a voltage VSL2 of the signal line SL2 also increase.

Next, in an auto-zero (AZ) period T1 in which the comparator 31 performs the auto-zero, the switch 341 and the switch 342 connected to the comparator 31 are put into an on-state on the basis of the auto-zero signal of a high level. When the auto-zero period T1 elapses, the switch 341 and the switch 342 are switched from the on-state to an off-state.

Next, in a pre-charge (P)-phase period T2, the comparator 31 outputs a comparison result between the ramp signal RAMP and a pixel signal output from the pixel 21 after the reset signal RST. This pixel signal includes only a charge component accumulated in advance in the FD 213, and does not include a charge component accumulated in the photodiode 211.

Next, in an FD boost period T3, the voltage VFD is boosted as the voltage FDB at the other end of the FD 213 is boosted. At this time, the selection transistor 217 is put into the off-state on the basis of the selection signal SEL of a low level. Furthermore, immediately before the FD boost period T3 (boosting period), the first switch 323 is switched from the on-state to the off-state as the control signal SW0 changes from the high level to a low level. At the same time, the second switch 324 is switched from the off-state to the on-state as the control signal SW1 changes from the low level to a high level. Therefore, the voltage of the signal line SL2 is held by the capacitor 325.

Moreover, in the latter half of the FD boost period T3, the transfer transistor 212 enters the on-state on the basis of the transfer signal TRG of a high level. Therefore, the charge accumulated in the photodiode 211 is transferred to the FD 213. Thereafter, in a data (D)-phase, the selection transistor 217 is switched from the off-state to the on-state, and thus, a pixel signal including a charge component accumulated in the photodiode 211 is input to the non-inverting input terminal (+) of the comparator 31 through the correction circuit 32. The comparator 31 outputs a comparison result between the pixel signal and a ramp signal to the latch circuit 33.

In the imaging device 1 according to the present embodiment described above, the voltage VFD of the node 214 is boosted when the charge accumulated in the photodiode 211 is transferred to the FD 213. Therefore, the charge transfer efficiency can be improved. When the voltage VFD increases, the voltage VSL2 of the signal line SL2 also increases. When the amount of such an increase is large, a leakage current sometimes flows from the non-inverting input terminal (+) to the transistor 343 through the switch 341.

In the present embodiment, however, the selection transistor 217 is put into the off-state in the FD boost period T3 as depicted in FIG. 4. Therefore, the signal line SL1 is interrupted, and thus, it is possible to avoid an increase in the potential of the non-inverting input terminal (+) of the comparator 31. On the other hand, when the signal line SL1 is interrupted, the potential of the non-inverting input terminal (+) decreases. Therefore, a settling time for restoring the potential increases, and a decrease in a frame rate of a captured image is concerned.

In this regard, the correction circuit 32 is provided in the present embodiment. With the correction circuit 32, the first switch 323 is in the on-state and the second switch 324 is in the off-state before the FD boost period T3. At this time, the voltage VSL2 of the signal line SL2 is expressed by the following Formula (1).

$$VSL2 = VSL1 - Vth1 \qquad (1)$$

In Formula (1), VSL1 represents the voltage of the signal line SL1, and Vth1 represents the threshold voltage between the gate and the source of the first transistor 321.

Meanwhile, the first switch 323 is in the off-state and the second switch 324 is in the on-state during the FD boost period T3. At this time, the voltage VSL2 of the signal line SL2 is expressed by the following Formula (2).

$$VSL2 = VHOLD - Vth2 \qquad (2)$$

In Formula (2), VHOLD represents the voltage of the capacitor 325, and Vth2 represents the threshold voltage between the gate and the source of the second transistor 322.

In the present embodiment, the capacitor 325 is charged until reaching the same potential as the voltage VSL1 before the FD boost period T3, and thus, the voltage VHOLD during the FD boost period T3 is at the same potential as the voltage VSL1. Furthermore, since the size of the second transistor 322 is the same as the size of the first transistor 321, the gate-source threshold voltages of both the transistors are the same. Therefore, the voltage VSL2 during the FD boost period T3 is held at the voltage before the FD boost period T3.

According to the present embodiment, it is possible to suppress a fluctuation of the voltage VSL2 in the FD boost period T3. Therefore, it is possible to suppress the decrease in the frame rate of the captured image while improving the transfer efficiency of the charge from the photodiode 211 to the node 214.

Furthermore, even if the threshold voltage Vth1 between the gate and the source of the first transistor 321 fluctuates due to a temperature, a manufacturing process, or the like, this fluctuation is offset by the threshold voltage Vth2 between the gate and the source of the second transistor 322 in the correction circuit 32 in the present embodiment. Therefore, a power supply circuit that adjusts the voltage of the signal line VSL2 according to the fluctuation of the threshold voltage Vth1 becomes unnecessary. Therefore, it is possible to achieve both the improvement in the charge transfer efficiency and the suppression of the decrease in the frame rate of the captured image with a simple and small circuit configuration. Moreover, power consumption can also be reduced.

Second Embodiment

Figure 5:
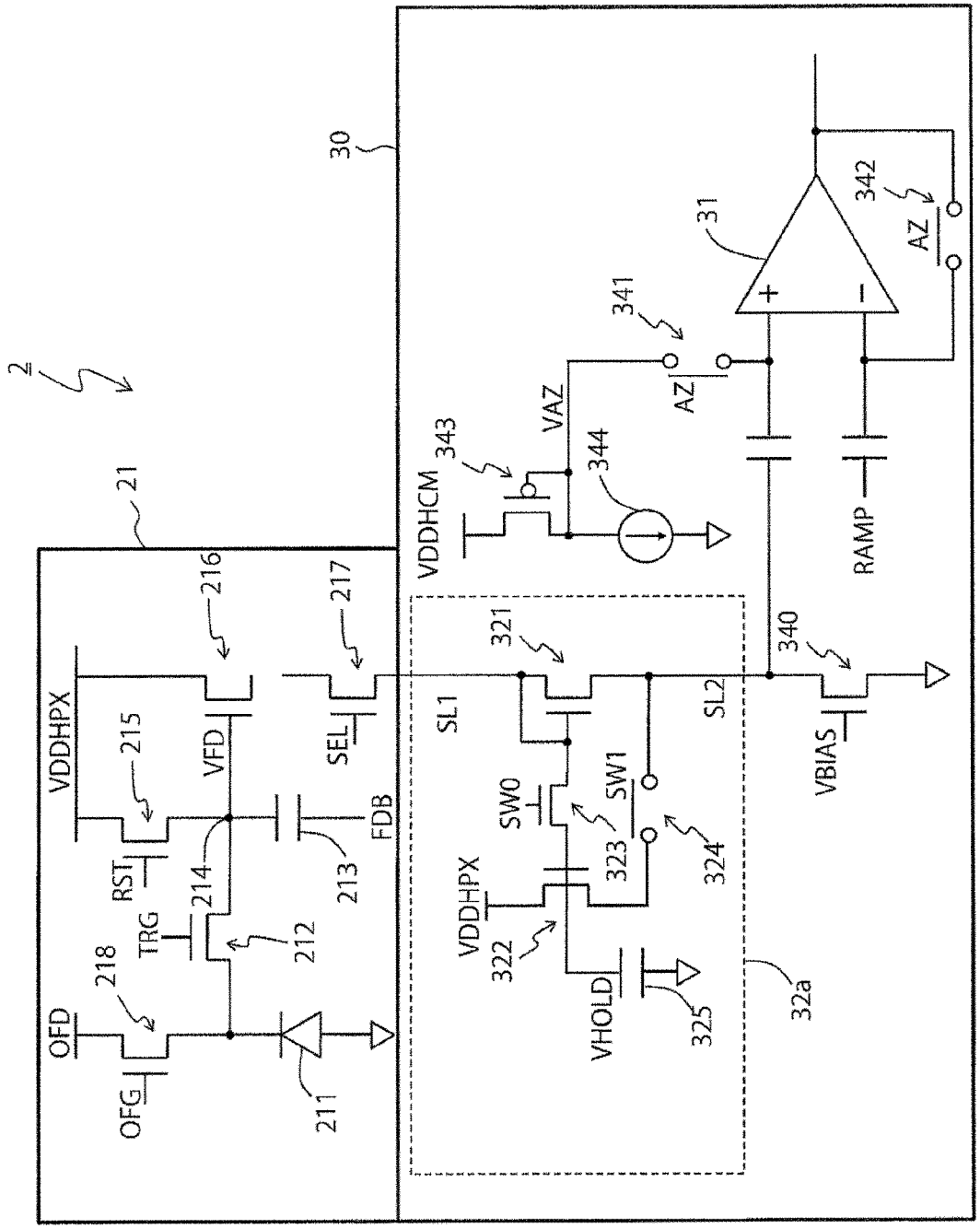
FIG. 5 is a circuit diagram of an imaging device according to a second embodiment.

FIG. 5 is a circuit diagram of an imaging device according to a second embodiment. Components similar to those of the first embodiment will be denoted by the same reference signs, and detailed description thereof will be omitted.

An imaging device 2 depicted in FIG. 5 includes a correction circuit 32a. In the correction circuit 32a, the first switch 323 includes an N-channel MOSFET. The first switch 323 has a drain that is connected to a gate of the first transistor 321 and a source that is connected to a gate of the second transistor 322. The first switch 323 performs a switching operation on the basis of the control signal SW0 input to a gate.

Figure 6:
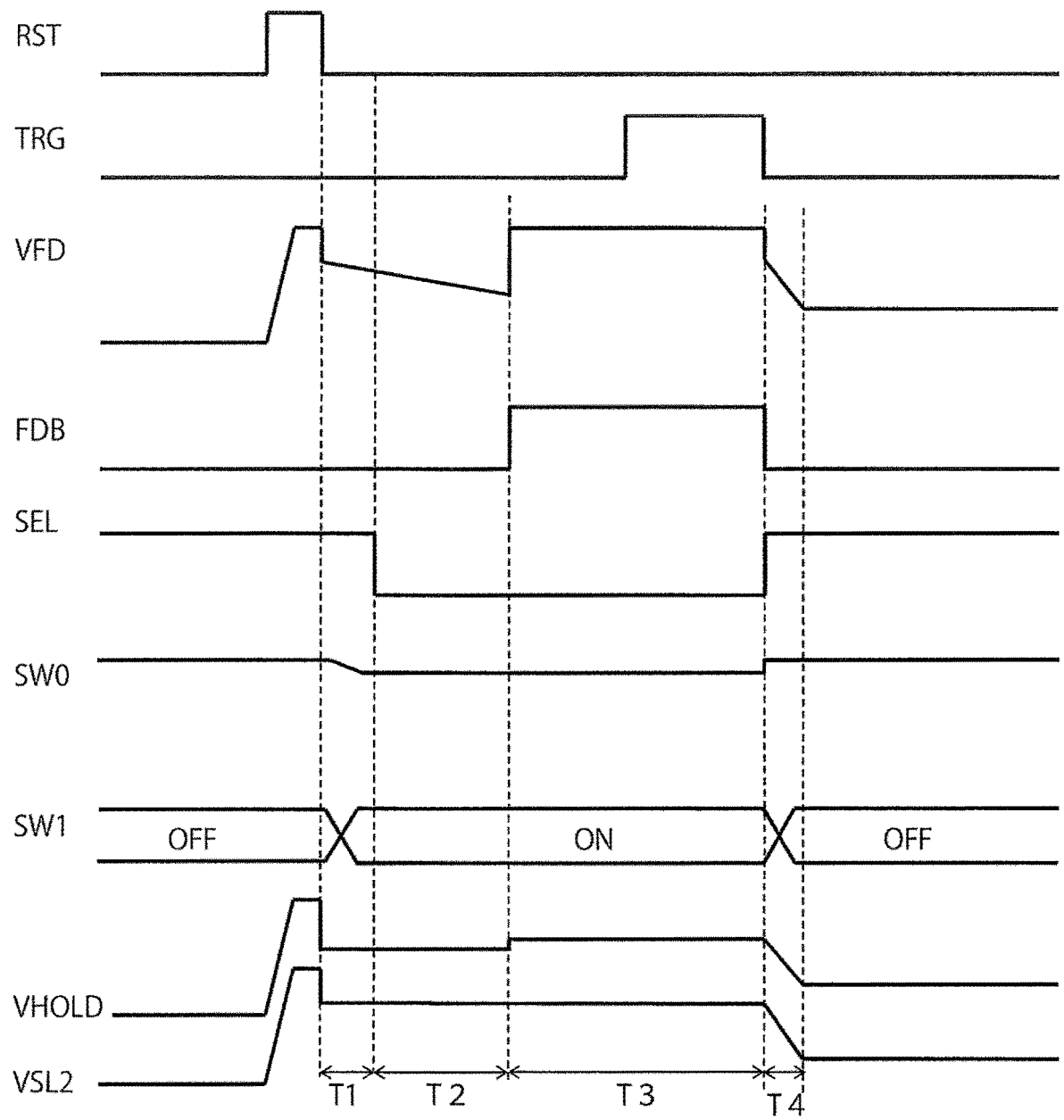
FIG. 6 is a timing chart of the imaging device according to the second embodiment.

FIG. 6 is a timing chart of the imaging device 2 according to the present embodiment. Hereinafter, the operation of the imaging device 1 will be described focusing on differences from the first embodiment with reference to FIG. 6.

In the present embodiment, in the auto-zero (AZ) period T1 of the comparator 31, the selection transistor 217 is switched from an on-state to an off-state, the first switch 323 is switched from an on-state to an off-state, and the second switch 324 is switched from an off-state to an on-state.

The first switch 323 includes the N-channel MOSFET as described above. Therefore, the voltage VHOLD of the capacitor 325 is held at a potential lower than the voltage VSL1 of the signal line SL1 due to effects of charge injection and feedthrough caused by signal falling. Any degree to which the voltage VHOLD becomes lower than the voltage VSL1 is determined by a ratio of a holding capacitance of the capacitor 325 to a channel area of the first switch 323 and a falling slew rate of the first switch 323.

In the P-phase period T2 subsequent to the auto-zero period T1, the comparator 31 outputs a comparison result between a pixel signal not including a charge component accumulated in the photodiode 211 and the ramp signal RAMP similarly to the first embodiment while maintaining the state of each of the selection transistor 217, the first switch 323, and the second switch 324.

Even in the FD boost period T3 subsequent to the P-phase period T2, the selection transistor 217, the first switch 323, and the second switch 324 are maintained in the same states as those in the auto-zero period T1. Thereafter, the state of each of the selection transistor 217, the first switch 323, and the second switch 324 is switched in a D-phase period in the FD boost period T3. That is, the selection transistor 217 is switched from the off-state to the on-state, the first switch 323 is switched from the off-state to the on-state, and the second switch 324 is switched from the on-state to the off-state.

The correction circuit 32a has a function of correcting a sunspot by starting control to switch the states of the selection transistor 217, the first switch 323, and the second switch 324 from the auto-zero period T1 as described above. The sunspot is generated because light with a large amount of light enters the photodiode 211, and the voltage VFD and the voltage VSL2 decrease during the P-phase period T2. The sunspot affects the quality of an output image.

However, the correction circuit 32a holds the voltage VSL2 immediately after the reset signal RST, that is, in the auto-zero period T1 according to the present embodiment. Therefore, the output image is not affected by the sunspot.

Note that the voltage VHOLD is slightly lower than the voltage VSL1 due to the charge injection and feedthrough effects in the present embodiment. The quality of the output image may also be affected by such a fluctuation amount. As a solution for this, for example, it is desirable to make the falling slew rate of the first switch 323 slow. Furthermore, the voltage at the time of falling of the first switch 323 is desirably set to a value slightly lower than the voltage VSL1 in the auto-zero period T1 and the P-phase period T2, instead of 0 V, in the P-phase period T2 and the FD boost period T3.

Third Embodiment

Figure 7:
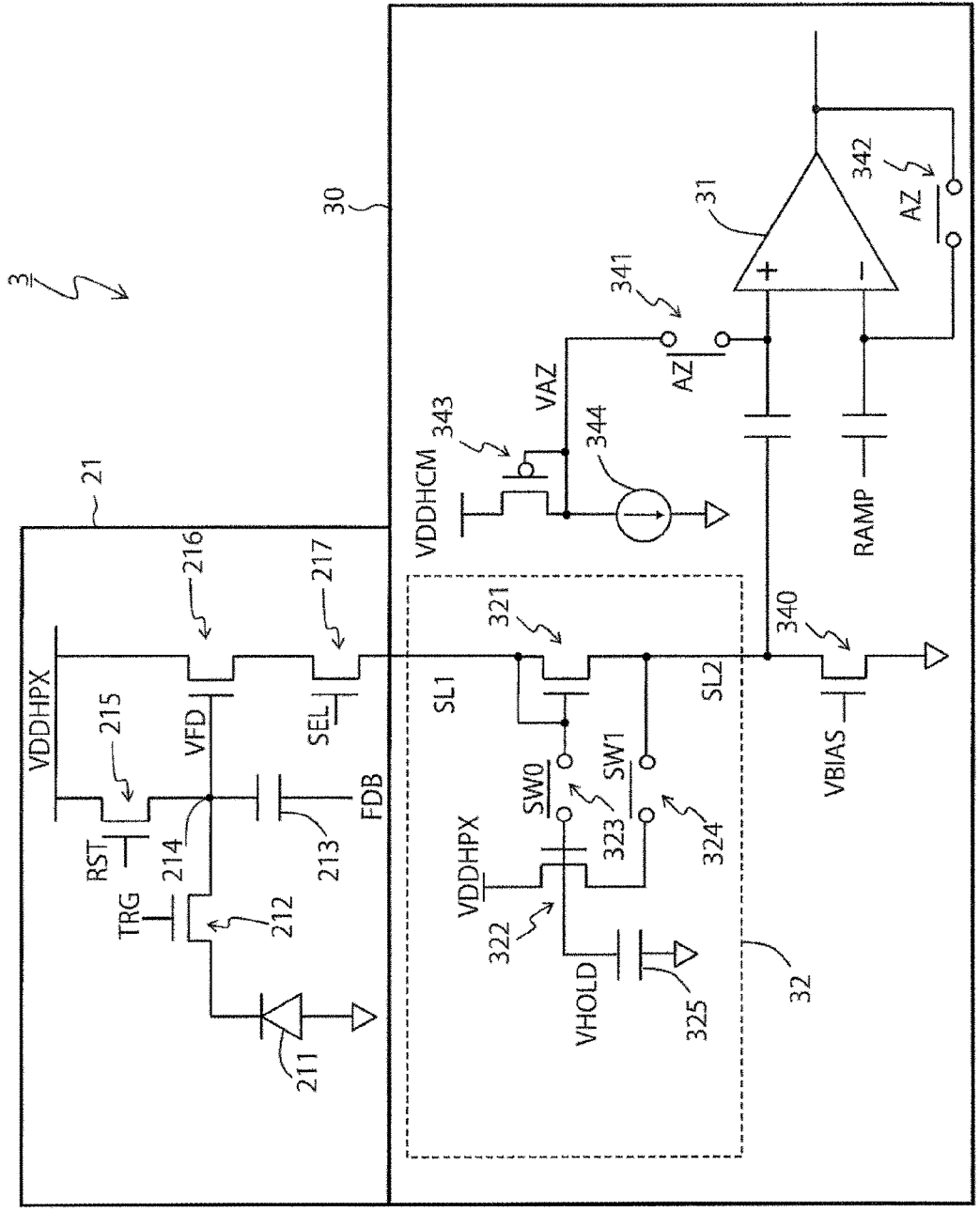
FIG. 7 is a circuit diagram of an imaging device of an imaging device according to a third embodiment.

FIG. 7 is a circuit diagram of an imaging device of an imaging device according to a third embodiment. Components similar to those of the first embodiment described above will be denoted by the same reference signs, and detailed description thereof will be omitted.

An imaging device 3 according to the present embodiment functions as an image sensor of a rolling shutter system in which timings for charge accumulation (exposure) are different among the plurality of pixels 21. As depicted in FIG. 7, a configuration of each of the pixels 21 is the same as that of the pixel 21 (see FIG. 3) described in the first embodiment except that the discharge transistor 218 is not provided.

Furthermore, in the present embodiment as well, operations in the auto-zero period T1, the P-phase period T2, the FD boost period T3, and a D-phase period are similar to those in the first embodiment. Therefore, the voltage VSL2 in the FD boost period T3 is held at a voltage in the P-phase period T2 before the FD boost period T3. Therefore, in the present embodiment as well, it is possible to suppress a decrease in a frame rate while improving charge transfer efficiency.

Furthermore, control to switch states of the selection transistor 217, the first switch 323, and the second switch 324 may be started from the auto-zero period T1 similarly to the second embodiment described above. In this case, it is possible to avoid deterioration in quality of an output image with respect to a sunspot.

Fourth Embodiment

Figure 8:
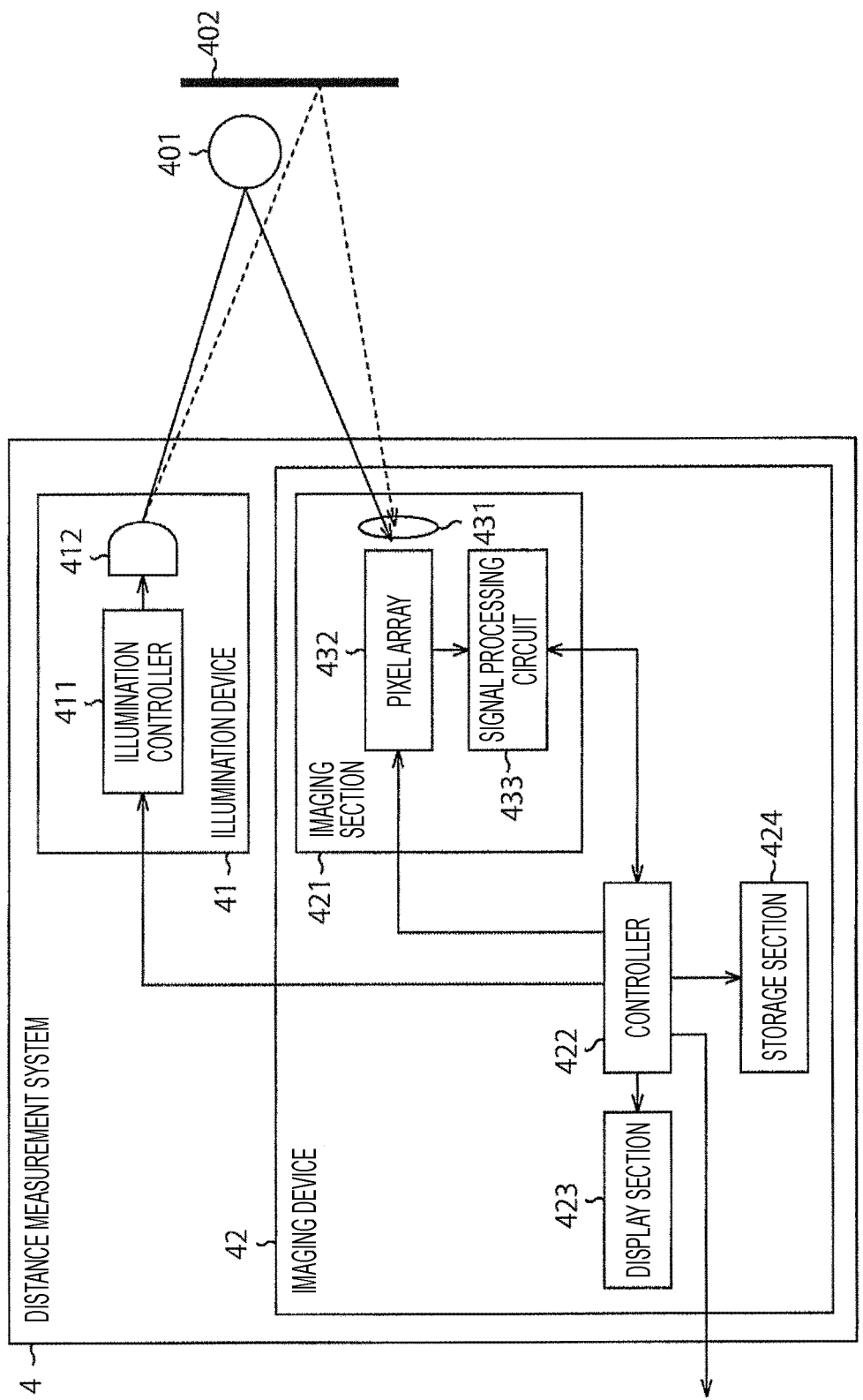
FIG. 8 is a block diagram depicting a configuration example of a distance measurement system according to a fourth embodiment.

FIG. 8 is a block diagram depicting a configuration example of a distance measurement system according to a fourth embodiment. A distance measurement system 4 depicted in FIG. 4 is a system that captures a distance image using a time of flight (ToF) method, and includes an illumination device 41 and an imaging device 42.

The illumination device 41 includes an illumination controller 411 and a light emitting element 412. The illumination controller 411 controls a pattern of distance measurement light emitted from the light emitting element 412 on the basis of control of a controller 422. Specifically, the illumination controller 411 controls the pattern of the distance measurement light emitted from the light emitting element 412 according to an irradiation code included in an irradiation signal supplied from the controller 422. For example, the irradiation code includes two values which are "1" (high) and "0" (low). The illumination controller 411 turns on the light emitting element 412 when the value of the irradiation code is "1", and turns off the light emitting element 412 when the value of the irradiation code is "0".

The light emitting element 412 emits distance measurement light in a predetermined wavelength range on the basis of the control of the illumination controller 411. The light emitting element 412 is, for example, an infrared laser diode. A type of the light emitting element 412 and the wavelength range of the distance measurement light can be freely set according to use applications of the distance measurement system 4 or the like.

The imaging device 42 receives reflected light of the distance measurement light reflected by a subject 401 and a subject 402. The imaging device 42 includes an imaging section 421, the controller 422, a display section 423, and a storage section 424.

The imaging section 421 includes a lens 431, a pixel array 432, and a signal processing circuit 433. The lens 431 forms an image of incident light on the pixel array 432. Note that the lens 431 may have any configuration, and for example, the lens 431 may be configured using a plurality of lens groups.

The pixel array 432 performs imaging of the subject 401, the subject 402, and the like on the basis of the control of the controller 422. Furthermore, the pixel array 432 outputs a pixel signal obtained by the imaging to the signal processing circuit 433. In the pixel array 432, the plurality of pixels 21 is two-dimensionally arranged, which is similar to the pixel array 20 described in the first embodiment.

The signal processing circuit 433 processes the pixel signal of the pixel array 432 on the basis of the control of the controller 422. For example, the signal processing circuit 433 detects a distance to a subject on the basis of the pixel signal of the pixel array 432 and generates a distance image indicating the distance to the subject. The comparator 31, the correction circuit 32, and the like described in the first embodiment are arranged in the signal processing circuit 433.

The controller 422 includes, for example, a control circuit such as a field programmable gate array (FPGA) or a digital signal processor (DSP), a processor and the like. The controller 422 controls the illumination controller 411, the pixel array 432, and the signal processing circuit 433.

The display section 423 includes, for example, a panel display device such as a liquid crystal display device or an organic electro luminescence (EL) display device.

The storage section 424 can include any storage device, any storage medium, or the like, and stores the distance image or the like.

Figure 9:
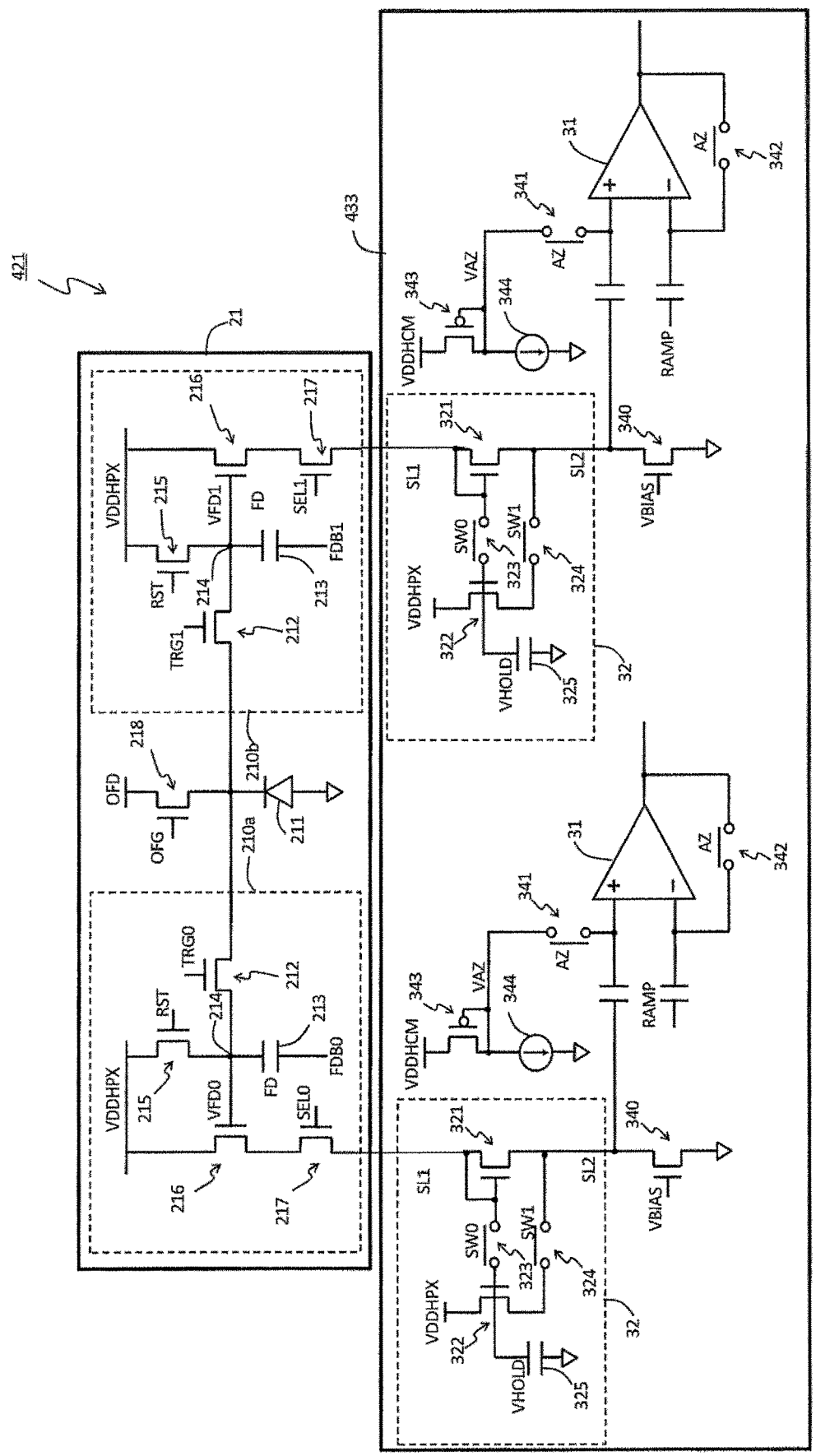
FIG. 9 is a diagram depicting circuit configurations of a pixel and a signal processing circuit according to the fourth embodiment.

FIG. 9 is a diagram depicting circuit configurations of the pixel 21 and the signal processing circuit 433 according to the present embodiment.

First, the circuit configuration of the pixel 21 will be described. As depicted in FIG. 9, the pixel 21 includes a detection circuit 210a and a detection circuit 210b. Each of the detection circuit 210a and the detection circuit 210b is connected to a cathode of the photodiode 211, and detects charge accumulated in the photodiode 211 at different timings.

The detection circuit 210a includes the transfer transistor 212, the FD 213, the node 214, the reset transistor 215, the amplification transistor 216, and the selection transistor 217. On the other hand, the detection circuit 210b is paired with the detection circuit 210a, and includes the transfer transistor 212, the FD 213, the node 214, the reset transistor 215, the amplification transistor 216, and the selection transistor 217. Since these elements are described in detail in the first embodiment, description thereof will be omitted.

Next, the circuit configuration of the signal processing circuit 433 will be described. In the signal processing circuit 433, the correction circuits 32 are connected to sources of the selection transistors 217 of the detection circuit 210a and the detection circuit 210b, respectively. Since the circuit configuration of each of the correction circuits 32 is similar to that of the first embodiment, description thereof will be omitted.

Furthermore, the correction circuits 32 are connected to non-inverting input terminals (+) of the comparators 31, respectively, similarly to the first embodiment. Moreover, the switch 341, the switch 342, the transistor 343, and the current source 344 are also provided around each of the comparators 31 similarly to the first embodiment.

In the present embodiment, the pixel array 432 is formed on the first semiconductor substrate 110, and the signal processing circuit 433 is formed on the second semiconductor substrate 120 bonded to the first semiconductor substrate 110 similarly to the first embodiment. Note that the pixel array 432 and the signal processing circuit 433 may be formed on the first semiconductor substrate 110 together without being limited to the two-layer structure described above.

Figure 10:
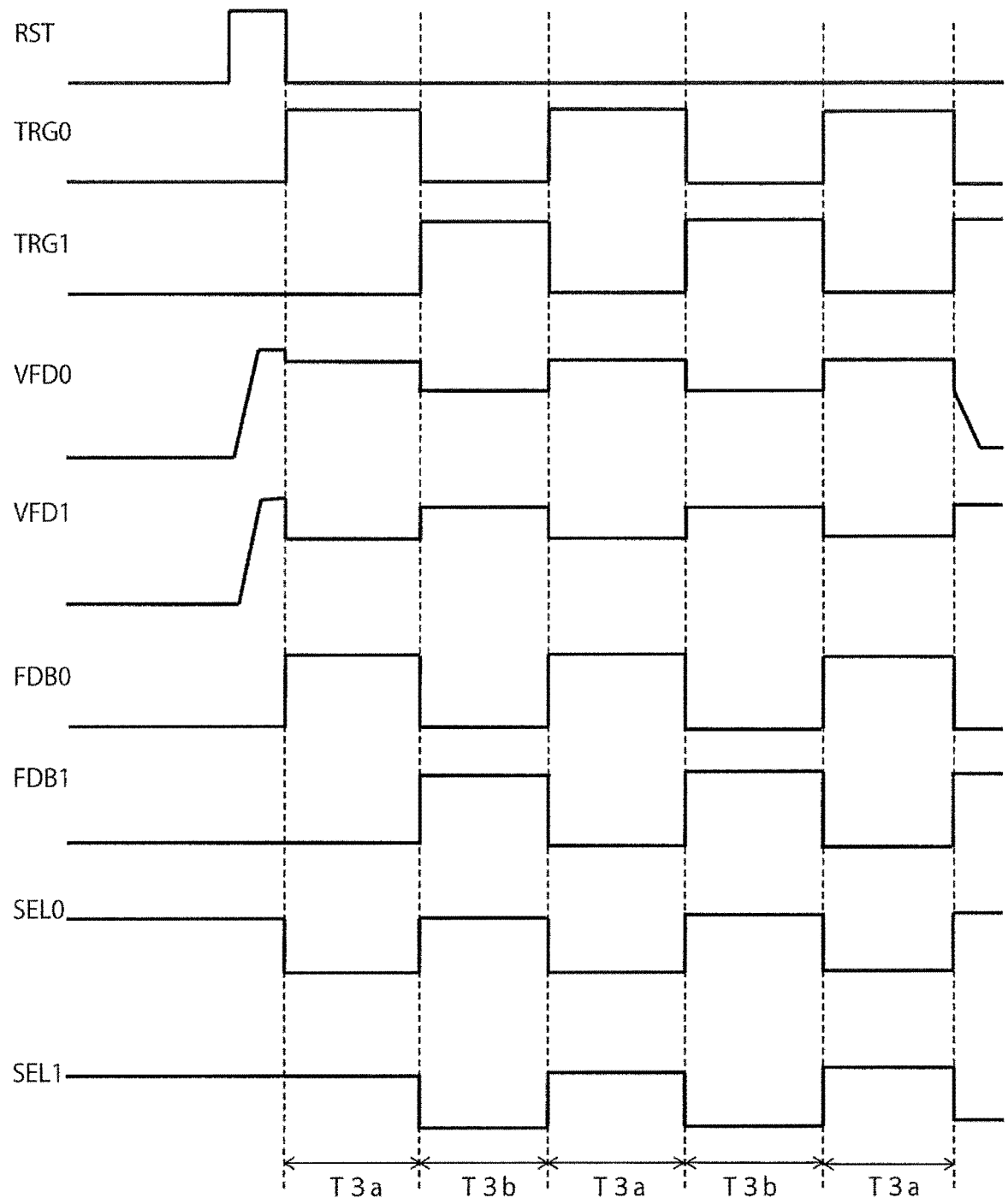
FIG. 10 is a timing chart of the imaging device according to the fourth embodiment.

FIG. 10 is a timing chart of the distance measurement system 4 according to the present embodiment. Hereinafter, the operation of the distance measurement system 4 will be described with reference to FIG. 10.

First, the reset signal RST of a high level is simultaneously input to each of gates of the reset transistors 215 of the detection circuit 210a and the detection circuit 210b. At this time, since each of the reset transistors 215 is put into an on-state, a voltage VFD0 of the node 214 of the detection circuit 210a and a voltage VFD1 of the node 214 of the detection circuit 210b increase.

Next, a transfer signal TRG0 of a high level is input to the transfer transistor 212 of the detection circuit 210a at a predetermined cycle. Furthermore, a transfer signal TRG1 of a high level is input to the transfer transistor 212 of the detection circuit 210b at a predetermined cycle. The transfer signal TRG0 of a high-level and the transfer signal TRG1 of a high-level are alternately input to the transfer transistors 212 of the respective detection circuits.

During a period in which the transfer signal TRG0 is at the high level, the voltage VED0 of the node 214 is boosted as a voltage FDB0 at the other end of the FD 213 is boosted in the detection circuit 210a. Therefore, the period in which the transfer signal TRG0 is at the high level is an FD boost period T3a of the detection circuit 210a. On the other hand, during a period in which the transfer signal TRG1 is at the high level, the voltage VFD1 of the node 214 of the detection circuit 210b is boosted as a voltage FDB1 at the other end of the FD 213 is boosted in the detection circuit 210b. Therefore, the period in which the transfer signal TRG1 is at the high level is an FD boost period T3b of the detection circuit 210b.

Before the FD boost period T3a, the first switch 323 is in an on-state and the second switch 324 is in an off-state in the correction circuit 32 connected to the detection circuit 210a. Furthermore, during the FD boost period T3a, the first switch 323 is put into an off-state and the second switch 324 is put into an on-state in the correction circuit 32 described above. Therefore, the voltage VSL2 during the FD boost period T3a is held at a voltage before the FD boost period T3a similarly to the first embodiment.

Furthermore, before the FD boost period T3b, the first switch 323 is in the on-state and the second switch 324 is in the off-state in the correction circuit 32 connected to the detection circuit 210b. Furthermore, during the FD boost period T3b, the first switch 323 is put into the off-state and the second switch 324 is put into the on-state in the correction circuit 32 described above. Therefore, the voltage VSL2 during the FD boost period T3b is also held at a voltage before the FD boost period T3b similarly to the first embodiment.

After the FD boost period T3a, a pixel signal output from the detection circuit 210a is read by the signal processing circuit 433 at a timing when the voltage VFD0 becomes lower than a predetermined value. Furthermore, after the FD boost period T3b, a pixel signal output from the detection circuit 210b is read by the signal processing circuit 433 at a timing when the voltage VFD1 becomes lower than a predetermined value. Thereafter, the distance from the distance measurement system 4 to each of the subjects 401 and 402 can be measured by calculating a difference between image signals read by the respective detection circuits.

According to the present embodiment described above, it is possible to suppress a fluctuation of a voltage of the non-inverting input terminal (+) of the comparator 31 in the FD boost period similarly to the other embodiments. Therefore, it is possible to suppress a decrease in a frame rate while improving charge transfer efficiency.

<Application Example to Mobile Body>

The technology according to an embodiment of the present disclosure (present technology) can be applied to various products. For example, the technology according to the present disclosure may be realized as a device mounted on any type of mobile body such as an automobile, an electric vehicle, a hybrid electric vehicle, a motorcycle, a bicycle, a personal mobility, an airplane, a drone, a ship, or a robot.

Figure 11:
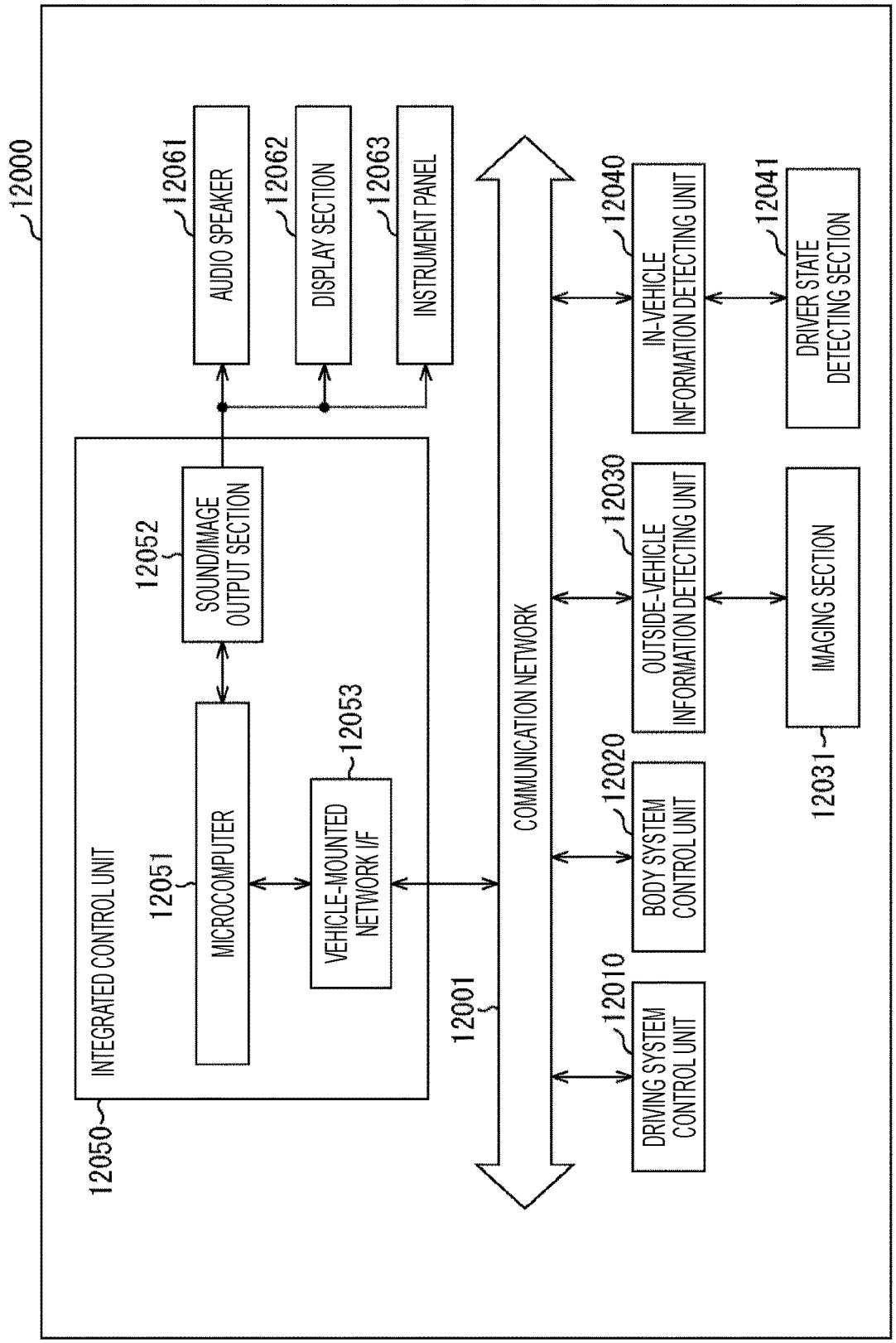
FIG. 11 is a block diagram depicting an example of schematic configuration of a vehicle control system.

FIG. 11 is a block diagram depicting an example of schematic configuration of a vehicle control system as an example of a mobile body control system to which the technology according to the present disclosure can be applied.

The vehicle control system 12000 includes a plurality of electronic control units connected to each other via a communication network 12001. In the example depicted in FIG. 11, the vehicle control system 12000 includes a driving system control unit 12010, a body system control unit 12020, an outside-vehicle information detecting unit 12030, an in-vehicle information detecting unit 12040, and an integrated control unit 12050. Furthermore, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound or an image to an output device capable of visually or auditorily notifying an occupant of the vehicle or the outside of the vehicle of information. In the example of FIG. 11, an audio speaker 12061, a display section 12062, and an instrument panel 12063 are illustrated as the output device. The display section 12062 may, for example, include at least one of an on-board display or a head-up display.

Figure 12:
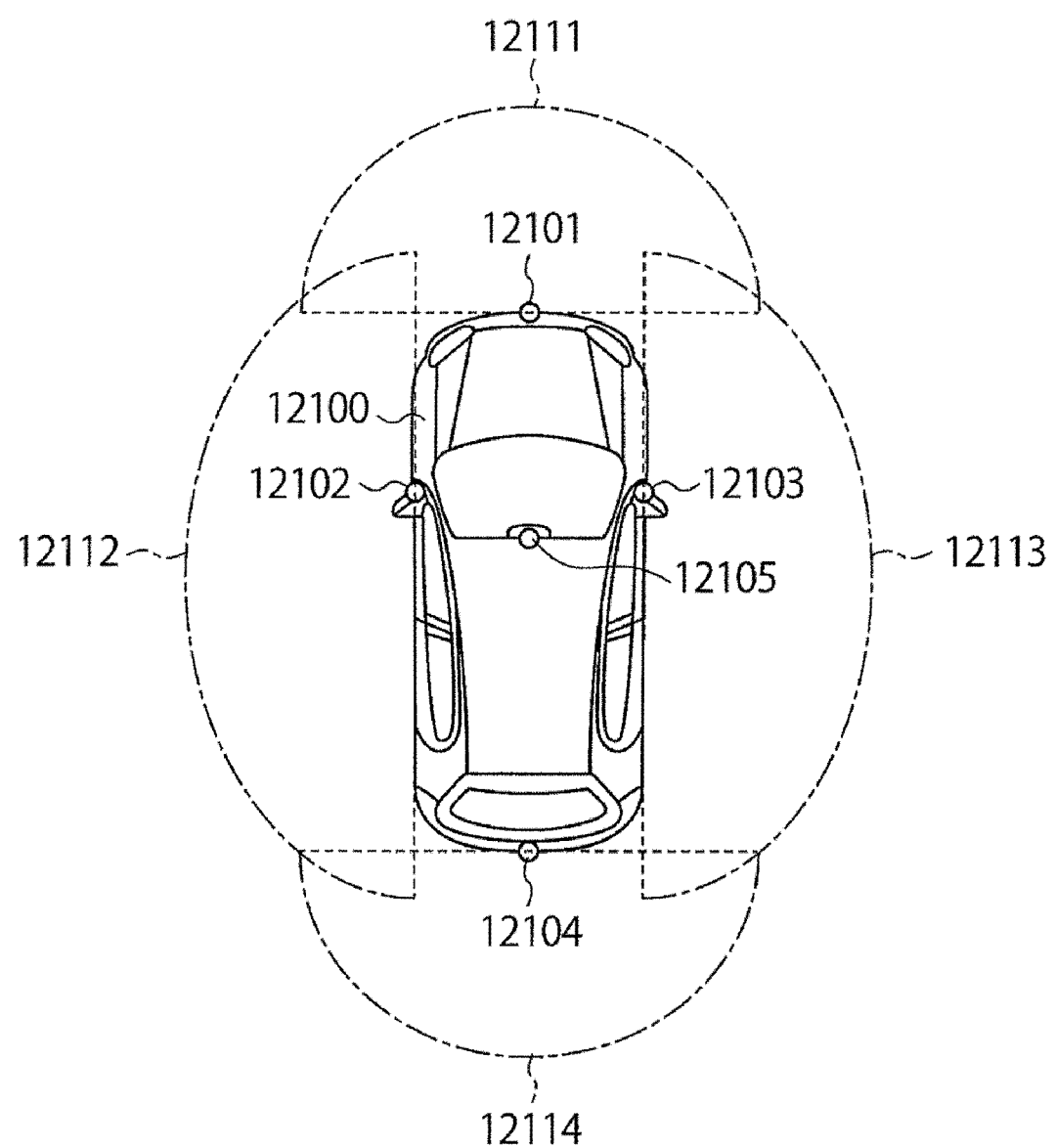
FIG. 12 is a diagram of assistance in explaining an example of installation positions of an outside-vehicle information detecting section and an imaging section.

FIG. 12 is a diagram depicting an example of the installation position of the imaging section 12031.

In FIG. 12, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 12 depicts an example of photographing ranges of the imaging sections 12101 to 12104. An imaging range 12111 represents the imaging range of the imaging section 12101 provided to the front nose. An imaging range 1211212113 represents the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

The example of the vehicle control system to which the technology according to the present disclosure can be applied has been described above. The technology according to the present disclosure can be applied to, for example, the imaging section 12031 and the like in the configuration described above. Specifically, the imaging section 421 can be applied to the imaging section 12031. By applying the technology according to the present disclosure, a captured image with higher distance measurement accuracy can be obtained, whereby safety can be improved.

Note that the present technology can have the following configurations.

(1) An imaging device including:
   a photoelectric conversion element;
   a signal converter that is boosted when charge transferred from the photoelectric conversion element is converted into a pixel signal;
   a selection transistor that interrupts a signal line of the pixel signal during a boosting period of the signal converter;
   a comparator including a non-inverting input terminal to which the pixel signal is input via the selection transistor, an inverting input terminal to which a ramp signal is input, and an output terminal which outputs a comparison result between the pixel signal and the ramp signal; and a correction circuit that holds a potential of the non-inverting input terminal in the boosting period at a potential of the non-inverting input terminal before the boosting period.

(2) The imaging device according to (1), in which the correction circuit includes:
a first transistor arranged between the selection transistor and the non-inverting input terminal;
a second transistor paired with the first transistor;
a first switch arranged between a gate of the first transistor and a gate of the second transistor;
a second switch arranged between a source of the first transistor and a source of the second transistor; and
a capacitor connected to the gate of the second transistor, and
the first switch is in an off-state and the second switch is in an on-state in the boosting period.

(3) The imaging device according to (2), in which a threshold voltage between the gate and the source of the first transistor is equal to a threshold voltage between the gate and the source of the second transistor.

(4) The imaging device according to (2), in which the first switch is switched from an on-state to the off-state, and the second switch is switched from an off-state to the on-state immediately before the boosting period.

(5) The imaging device according to (2), in which the selection transistor is switched from an on-state to an off-state, the first switch is switched from an on-state to the off-state, and the second switch is switched from an off-state to the on-state in an auto-zero period of the comparator before the boosting period.

(6) The imaging device according to (5), in which the first switch is an N-channel MOSFET.

(7) The imaging device according to (1), in which the photoelectric conversion element, the signal converter, and the selection transistor are arranged on a first semiconductor substrate, and the comparator and the correction circuit are arranged on a second semiconductor substrate stacked on the first semiconductor substrate.

(8) The imaging device according to (1), in which the photoelectric conversion element, the signal converter, the selection transistor, the comparator, and the correction circuit are arranged on one semiconductor substrate.

(9) The imaging device according to (1), in which the signal processing circuit is a column analog-to-digital converter (ADC) that processes the pixel signal for each column of the plurality of pixels.

(10) The imaging device according to (9) adopting a global shutter system in which the plurality of photoelectric conversion elements accumulates the charge at the same timing.

(11) The imaging device according to (9) adopting a rolling shutter system in which the plurality of photoelectric conversion elements accumulates the charge at different timings.

(12) A distance measurement system including:
an illumination device that emits distance measurement light; and
an imaging device that receives reflected light of the distance measurement light,
in which the imaging device includes
a photoelectric conversion element that photoelectrically converts the reflected light,
a signal converter that is boosted when charge transferred from the photoelectric conversion element is converted into a pixel signal,
a selection transistor that interrupts a signal line of the pixel signal during a boosting period of the signal converter,
a comparator including a non-inverting input terminal to which the pixel signal is input via the selection transistor, an inverting input terminal to which a ramp signal is input, and an output terminal which outputs a comparison result between the pixel signal and the ramp signal, and
a correction circuit that holds a potential of the non-inverting input terminal in the boosting period at a potential of the non-inverting input terminal before the boosting period.

(13) The distance measurement system according to (12), in which
the correction circuit includes:
a first transistor arranged between the selection transistor and the non-inverting input terminal;
a second transistor paired with the first transistor;
a first switch arranged between a gate of the first transistor and a gate of the second transistor;
a second switch arranged between a source of the first transistor and a source of the second transistor; and
a capacitor connected to the gate of the second transistor, and
the first switch is in an off-state and the second switch is in an on-state in the boosting period.

(14) The distance measurement system according to (13), in which a threshold voltage between the gate and the source of the first transistor is equal to a threshold voltage between the gate and the source of the second transistor.

(15) The distance measurement system according to (13), in which the first switch is switched from an on-state to the off-state, and the second switch is switched from an off-state to the on-state immediately before the boosting period.

(16) The distance measurement system according to (12), in which the photoelectric conversion element, the signal converter, and the selection transistor are arranged on a first semiconductor substrate, and the comparator and the correction circuit are arranged on a second semiconductor substrate stacked on the first semiconductor substrate.

(17) The distance measurement system according to (12), in which the photoelectric conversion element, the signal converter, the selection transistor, the comparator, and the correction circuit are arranged on one semiconductor substrate.

REFERENCE SIGNS LIST 1 to 3 Imaging device
4 Distance measurement system
20 Pixel array
21 Pixel
30 Signal processing circuit
31 Comparator
32, 32a Correction circuit
41 Illumination device
42 Imaging device
110 First semiconductor substrate
120 Second semiconductor substrate
211 Photodiode
213 FD
214 Node
216 Amplification transistor
217 Selection transistor
321 First transistor
322 Second transistor 323 First switch
324 Second switch
325 Capacitor
432 Pixel array
433 Signal processing circuit

The invention claimed is:

1. An imaging device, comprising:
a photoelectric conversion element;
a signal converter that is boosted when charge transferred from the photoelectric conversion element is converted into a pixel signal;
a selection transistor that interrupts a signal line of the pixel signal during a boosting period of the signal converter;
a comparator including a non-inverting input terminal to which the pixel signal is input via the selection transistor, an inverting input terminal to which a ramp signal is input, and an output terminal which outputs a comparison result between the pixel signal and the ramp signal; and
a correction circuit that holds a potential of the non-inverting input terminal in the boosting period at a potential of the non-inverting input terminal before the boosting period.

2. The imaging device according to claim 1, wherein the correction circuit includes:
a first transistor arranged between the selection transistor and the non-inverting input terminal;
a second transistor paired with the first transistor;
a first switch arranged between a gate of the first transistor and a gate of the second transistor;
a second switch arranged between a source of the first transistor and a source of the second transistor; and
a capacitor connected to the gate of the second transistor, and
the first switch is in an off-state and the second switch is in an on-state in the boosting period.

3. The imaging device according to claim 2, wherein a threshold voltage between the gate and the source of the first transistor is equal to a threshold voltage between the gate and the source of the second transistor.

4. The imaging device according to claim 2, wherein the first switch is switched from an on-state to the off-state, and the second switch is switched from an off-state to the on-state immediately before the boosting period.

5. The imaging device according to claim 2, wherein the selection transistor is switched from an on-state to an off-state, the first switch is switched from an on-state to the off-state, and the second switch is switched from an off-state to the on-state in an auto-zero period of the comparator before the boosting period.

6. The imaging device according to claim 5, wherein the first switch is an N-channel MOSFET.

7. The imaging device according to claim 1, wherein the photoelectric conversion element, the signal converter, and the selection transistor are arranged on a first semiconductor substrate, and the comparator and the correction circuit are arranged on a second semiconductor substrate stacked on the first semiconductor substrate.

8. The imaging device according to claim 1, wherein the photoelectric conversion element, the signal converter, the selection transistor, the comparator, and the correction circuit are arranged on one semiconductor substrate.

9. The imaging device according to claim 1, wherein
a plurality of the photoelectric conversion elements including the photoelectric conversion element is two-dimensionally arranged, and
the comparator and the correction circuit are provided for each of the plurality of photoelectric conversion elements.

10. The imaging device according to claim 9 adopting a global shutter system in which the plurality of photoelectric conversion elements accumulates the charge at a same timing.

11. The imaging device according to claim 9 adopting a rolling shutter system in which the plurality of photoelectric conversion elements accumulates the charge at different timings.

12. A distance measurement system, comprising:
an illumination device that emits distance measurement light; and
an imaging device that receives reflected light of the distance measurement light,
wherein the imaging device includes:
a photoelectric conversion element that photoelectrically converts the reflected light;
a signal converter that is boosted when charge transferred from the photoelectric conversion element is converted into a pixel signal;
a selection transistor that interrupts a signal line of the pixel signal during a boosting period of the signal converter;
a comparator including a non-inverting input terminal to which the pixel signal is input via the selection transistor, an inverting input terminal to which a ramp signal is input, and an output terminal which outputs a comparison result between the pixel signal and the ramp signal; and
a correction circuit that holds a potential of the non-inverting input terminal in the boosting period at a potential of the non-inverting input terminal before the boosting period.

13. The distance measurement system according to claim 12, wherein
the correction circuit includes:
a first transistor arranged between the selection transistor and the non-inverting input terminal;
a second transistor paired with the first transistor;
a first switch arranged between a gate of the first transistor and a gate of the second transistor;
a second switch arranged between a source of the first transistor and a source of the second transistor; and
a capacitor connected to the gate of the second transistor, wherein the first switch is in an off-state and the second switch is in an on-state in the boosting period.

14. The distance measurement system according to claim 13, wherein a threshold voltage between the gate and the source of the first transistor is equal to a threshold voltage between the gate and the source of the second transistor.

15. The distance measurement system according to claim 13, wherein the first switch is switched from an on-state to the off-state, and the second switch is switched from an off-state to the on-state immediately before the boosting period.

16. The distance measurement system according to claim 12, wherein the photoelectric conversion element, the signal converter, and the selection transistor are arranged on a first semiconductor substrate, and the comparator and the correction circuit are arranged on a second semiconductor substrate stacked on the first semiconductor substrate.

17. The distance measurement system according to claim 12, wherein the photoelectric conversion element, the signal converter, the selection transistor, the comparator, and the correction circuit are arranged on one semiconductor substrate.

* * * * *